(12) United States Patent
Choi et al.

(10) Patent No.: US 10,264,687 B2
(45) Date of Patent: Apr. 16, 2019

(54) ROLLABLE DISPLAY DEVICE

(71) Applicant: SAMSUNG DISPLAY CO., LTD., Yongin-si, Gyeonggi-Do (KR)

(72) Inventors: Jin Hwan Choi, Seoul (KR); Sun Ho Kim, Seongnam-si (KR); Jeong Ho Kim, Seoul (KR); Bo Ik Park, Uiwang-si (KR); Tae An Seo, Hwaseong-si (KR); Jung Hun Lee, Hwaseong-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 3 days.

(21) Appl. No.: 15/626,501

(22) Filed: Jun. 19, 2017

(65) Prior Publication Data
US 2018/0014415 A1    Jan. 11, 2018

(30) Foreign Application Priority Data

Jul. 6, 2016    (KR) ........................ 10-2016-0085534

(51) Int. Cl.
| | | |
|---|---|---|
| H05K 5/00 | (2006.01) | |
| H05K 5/02 | (2006.01) | |
| G09F 9/30 | (2006.01) | |

(52) U.S. Cl.
CPC ......... *H05K 5/0017* (2013.01); *H05K 5/0217* (2013.01); *H05K 5/0247* (2013.01); *G09F 9/301* (2013.01)

(58) Field of Classification Search
None
See application file for complete search history.

(56) References Cited

U.S. PATENT DOCUMENTS

| | | | | |
|---|---|---|---|---|
| 2007/0241002 A1* | 10/2007 | Wu | ........................ | G06F 1/1601 206/150 |
| 2011/0227487 A1* | 9/2011 | Nichol | ................. | G02B 6/0018 315/158 |
| 2016/0037625 A1* | 2/2016 | Huitema | ................ | H05K 1/028 361/749 |
| 2016/0081180 A1* | 3/2016 | Huitema | ............. | H01L 51/0097 361/749 |
| 2016/0187929 A1* | 6/2016 | Kim | ....................... | G06F 1/1652 345/184 |

FOREIGN PATENT DOCUMENTS

| | | |
|---|---|---|
| KR | 101570869 | 11/2015 |
| KR | 1020150137216 | 12/2015 |
| KR | 1020160011718 | 2/2016 |
| KR | 1020160017247 | 2/2016 |
| KR | 1020160018293 | 2/2016 |

* cited by examiner

*Primary Examiner* — Courtney Smith
*Assistant Examiner* — Rashen E Morrison
(74) *Attorney, Agent, or Firm* — F. Chau & Associates, LLC

(57) ABSTRACT

A rollable display device includes a roller, a display panel configured to be wound around the roller in a wound-up configuration and to display an image in an unwound configuration, a housing configured to house the display panel in the wound-up configuration and the roller, and a roller controller connected to the roller and configured to change a radius of the roller.

19 Claims, 14 Drawing Sheets

ROLLABLE DISPLAY DEVICE

CROSS-REFERENCE TO RELATED APPLICATION

This application claims priority under 35 U.S.C. § 119 to Korean Patent Application No. 10-2016-0085534 filed in the Korean Intellectual Property Office on Jul. 6, 2016, the disclosure of which is incorporated by reference herein in its entirety.

TECHNICAL FIELD

The present invention relates to a rollable display device.

DISCUSSION OF THE RELATED ART

Display devices such as an organic light emitting display devices and a liquid crystal display devices are manufactured by disposing various layers and elements on a substrate. Generally, glass is used as the substrate of display devices. Since the glass substrate is rigid, it is difficult to deform the display devices. Currently, display devices using a flexible substrate, which is relatively light, has impact resistance, and may be deformed, are under development.

The flexible display device may be classified as a bendable display device, a foldable display device, a rollable display device, or a stretchable display device depending on its application and form.

Further, a flexible display panel of the rollable display device is wound around a roller thereof, and the flexible display panel is unrolled from the roller.

While the flexible display panel is wound around the roller, stress is applied to the flexible display panel and accumulates throughout the flexible display panel in proportion to time. Accordingly, when the flexible display panel is wound around the roller for a predetermined period, the flexible display panel may deteriorate.

SUMMARY

According to an exemplary embodiment of the present inventive concept, a rollable display device includes a roller, a display panel configured to be wound around the roller in a wound-up configuration and to display an image in an unwound configuration, a housing configured to house the display panel in the wound-up configuration and the roller, and a roller controller connected to the roller and configured to change a radius of the roller.

In an exemplary embodiment of the present inventive concept, the rollable display device further includes a dummy panel connected to the roller and one end of the display panel.

In an exemplary embodiment of the present inventive concept, one end of the dummy panel is fixed to the roller.

In an exemplary embodiment of the present inventive concept, the roller controller includes a sensor that is connected to the roller and senses a rotation of the roller, and a radius varying driver that is connected to the sensor and the roller and is configured to change the radius of the roller.

In an exemplary embodiment of the present inventive concept, the roller includes a fixing portion extending in a radial direction from a rolling axis corresponding to a rotational central axis of the roller, a variable portion of which one end is connected to the fixing portion, and a roller case housing the fixing portion and the variable portion.

In an exemplary embodiment of the present inventive concept, the roller case is adhered to the other end of the variable portion.

In an exemplary embodiment of the present inventive concept, the fixing portion configured to be inserted into the variable portion, and when the variable portion is inserted into the fixing portion, the radius of the roller is reduced.

In an exemplary embodiment of the present inventive concept, the roller case includes a flexible film.

In an exemplary embodiment of the present inventive concept, the roller includes a roller case including a first end and a second end, and the roller case is wound such that the first end and the second end face each other.

In an exemplary embodiment of the present inventive concept, when the first end of the roller case is wound in an inside direction toward a rolling axis corresponding to a rotational central axis of the roller. The radius of the roller is reduced.

In an exemplary embodiment of the present inventive concept, the roller case includes a flexible film.

In an exemplary embodiment of the present inventive concept, the housing including a panel opening through which the display panel passes through in an unwound configuration.

In an exemplary embodiment of the present inventive concept, the rollable display device further includes a panel fixing portion configured to be positioned at the other end of the display panel and to have a height larger than a width of the panel opening.

According to an exemplary embodiment of the present inventive concept, a rollable display device includes a roller, a display panel configured to be wound around the roller in a wound-up configuration and to display an image in an unwound configuration, a housing configured to house the display panel and the roller, and a sensor configured to be positioned at the display panel and to generate a sensing signal for controlling a rotation of the roller.

In an exemplary embodiment of the present inventive concept, the rollable display device further includes a roller controller configured to be connected to the roller and the sensor. The roller controller stops the rotation of the roller or rotates the roller depending on a sensing signal transmitted from the sensor.

In an exemplary embodiment of the present inventive concept, the rollable display device further includes a pressing portion configured to connect to a panel fixing portion connected to the display panel. The pressing portion pushes or pulls the panel fixing portion.

In an exemplary embodiment of the present inventive concept, the rollable display device further includes the inside of the roller is filled.

According to an exemplary embodiment of the present inventive concept, a rollable display device includes a flexible display panel and a roller configured to receive the flexible display panel in a wound-up configuration and including a fixing portion extending in a radial direction from a rolling axis corresponding to a rotational central axis of the roller, and a variable portion including a first end connected to the fixing portion. The variable portion is configured to withdraw into the fixing portion. The rollable display device further includes a housing configured to house the flexible display panel in the wound-up configuration, the housing includes an opening, which the flexible display panel passes through in an unwound configuration. The rollable display device additionally includes a sensor to detect a rotation of the roller and a radius varying driver connected to the sensor and the variable portion and configured to alter the radius of the roller.

In an exemplary embodiment of the present inventive concept, the roller includes a roller case including a flexible film.

In an exemplary embodiment of the present inventive concept, the variable portion includes a second end, opposite to the first end of the variable portion, connected to the roller case. The roller case houses the fixing portion and the variable portion.

DETAILED DESCRIPTION OF THE EMBODIMENTS

Figure 1:
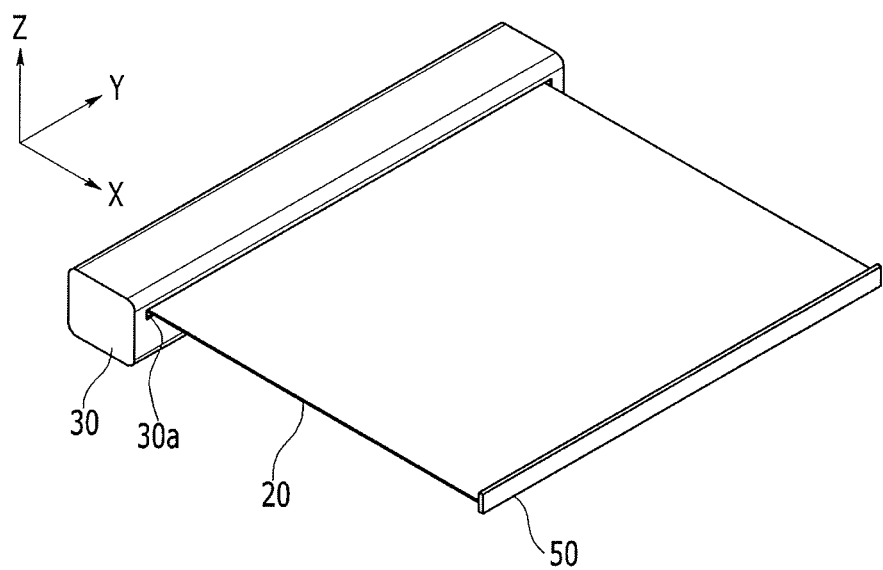
FIG. 1 illustrates a perspective view of a rollable display device according to an exemplary embodiment of the present invention.

Exemplary embodiments of the present invention will be described more fully hereinafter with reference to the accompanying drawings. It is to be understood that the present invention may, however, be embodied in different forms and thus should not be construed as being limited to the exemplary embodiments set forth herein. In the figures, like reference numerals may refer to like elements.

In the drawings, sizes of elements in the drawings may be exaggerated for clarity. In other words, since sizes and thicknesses of components in the drawings may be exaggerated for clarity, the following exemplary embodiments of the present invention are not limited thereto.

It will be understood that when an element or layer is referred to as being "on" another element or layer, the element or layer may be directly on another element or layer or intervening elements or layers.

Figure 2:
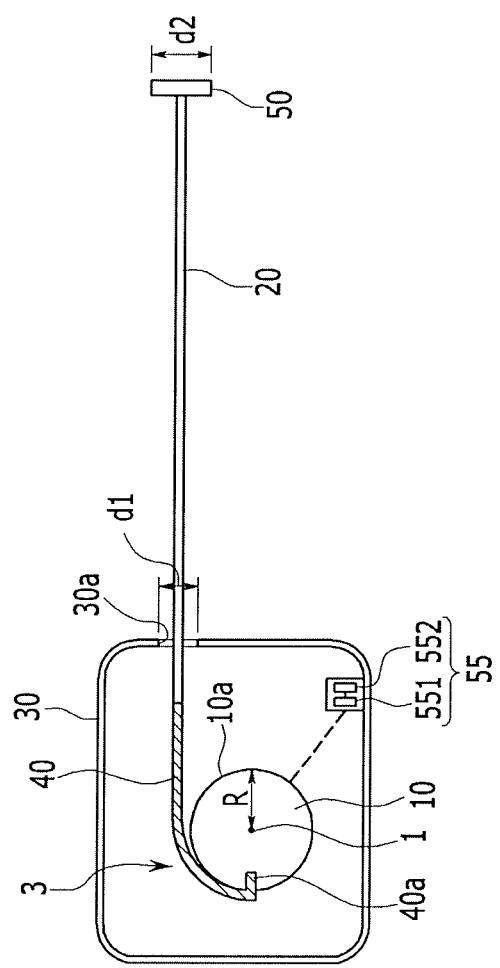
FIG. 2 illustrates a side cross-sectional view of a state in which a display panel of a rollable display device, according to an exemplary embodiment of the present invention, is unrolled.
Figure 3:
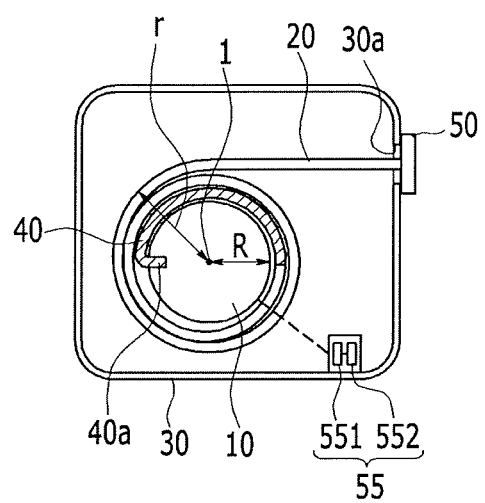
FIG. 3 illustrates a side cross-sectional view of a state in which a display panel is wound around a roller of a rollable display device according to an exemplary embodiment of the present invention.

FIG. 1 illustrates a perspective view of a rollable display device according to an exemplary embodiment of the present invention. FIG. 2 illustrates a side cross-sectional view of a state in which a display panel of a rollable display device according to an exemplary embodiment of the present invention is unrolled. FIG. 3 illustrates a side cross-sectional view of a state in which a display panel 20 is wound around a roller 10 of a rollable display device according to an exemplary embodiment of the present invention.

As shown in FIG. 1, FIG. 2, and FIG. 3, a rollable display device according to an exemplary embodiment of the present invention includes a roller 10, a display panel 20, a housing 30, a dummy panel 40, and a roller controller 55.

The roller 10 has a cylindrical shape, and extends in a first direction (Y). A radius (R) of the roller 10 may be changed. The radius (R) of the roller 10 is defined as a distance from a rolling axis 1 of the roller 10 extending in the first direction (Y) to an external circumferential surface 10a of the roller 10. The rolling axis 1 of the roller 10 may be located in the center of the roller 10 and may extend along the first direction (Y). A specific structure of the roller 10 will now be described with reference to the accompanying drawings.

Since the display panel 20 is flexible, it may be wound around the roller 10 in a wound-up configuration. In other words, the roller may receive the flexible display panel 20 in a wound-up configuration. The display panel 20 may include, for example, polyimide (PI), polyamide (PA), polyethylene terephthalate (PET), etc. The display panel 20 may display an image, and may be a flat display device such as an organic light emitting device, a liquid crystal display, or the like. The display panel 20 may be rolled or unrolled in the second direction (X). In other words, while the roller 10 is being rotated on the rolling axis 1 that extends in the first direction (Y), the display panel 20 may be rolled or unrolled.

The housing 30 may have a quadrangular pillar shape including an inner space 3. The display panel 20 and the roller 10 are housed in the inner space 3 of the housing 30. The housing 30 includes a panel entrance 30a (e.g., an opening) through which the display panel 20 enters or exits. In other words, the display panel 20 passes through the panel entrance 30a in an unwound configuration.

The dummy panel 40 connects the roller 10 and one end of the display panel 20 to each other. A first end 40a of the dummy panel 40 is inserted into and fixed to the roller 10. Accordingly, when the roller 10 rotates, the dummy panel 40 having the one end 40a fixed to the roller 10 is wound around the roller 10.

A panel fixing portion 50 having a height d2 that is larger than a width d1 of the panel entrance 30a is positioned at the other end of the display panel 20 opposite to the end connected to the dummy panel 40. Accordingly, when the panel fixing portion 50 contacts the housing 30, the rotation of the roller 10 stops. Thus, the operation in which the display panel 20 is wound around the roller 10 in a wound-up configuration stops. The panel fixing portion 50 may be a rectangular bar extending in the first direction (Y), but the shape of the panel fixing portion 50 is not limited thereto. In addition, the panel fixing portion 50 may be considered, for example, a handle. However, exemplary embodiments of the present invention are not limited thereto.

The roller controller 55 is connected to the roller 10 by a wire or wirelessly to control the radius (R) of the roller 10 so that the radius (R) may be changed. When the roller controller 55 detects that the rotation of the roller 10 has stopped, the roller controller 55 may reduce the radius (R) of the roller 10. The roller controller 55 includes a sensor 551 connected to the roller 10. The sensor 551 senses the rotation of the roller 10. The roller controller 55 further includes a radius varying driver 552 that is connected to the roller 10 and the sensor 551, and that changes the radius (R) of the roller 10.

As shown in FIG. 3, since the display panel 20 is bent in a state in which the display panel 20 is wound around the roller 10, the display panel 20 has a predetermined curvature radius (r) from the rolling axis 1 of the roller 10. In this case, since the display panel 20 may be closely and tightly wound around the roller 10, the curvature radius (r) of the display panel 20 is substantially the same as the radius (R) of the roller 10. Stress is applied to the bent display panel 20 described above when wound around the roller 10. In the present exemplary embodiment of the present invention, to minimize the stress applied to the display panel 20, the radius (R) of the roller 10 may be reduced when the display panel 20 is wound around the roller 10.

Figure 4:
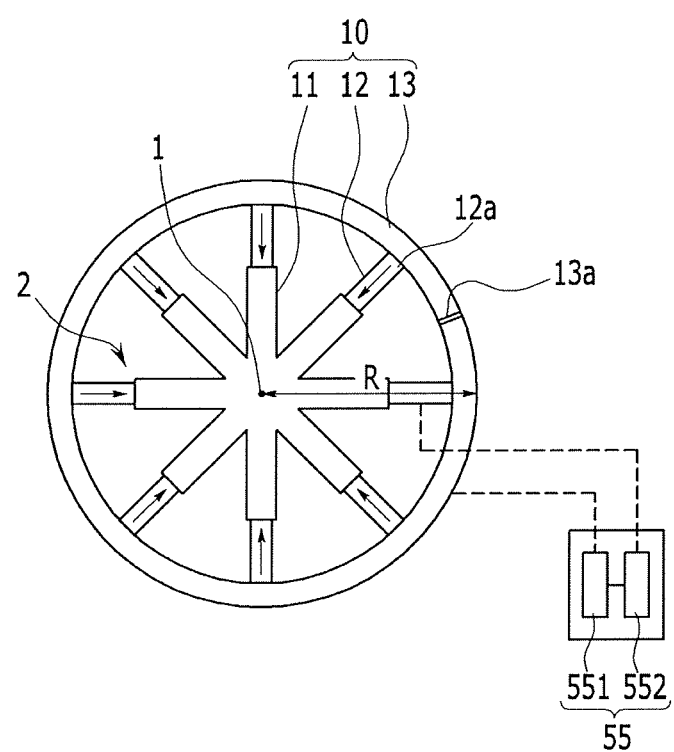
FIG. 4 illustrates an enlarged view of an internal structure of the roller of FIG. 3.
Figure 5:
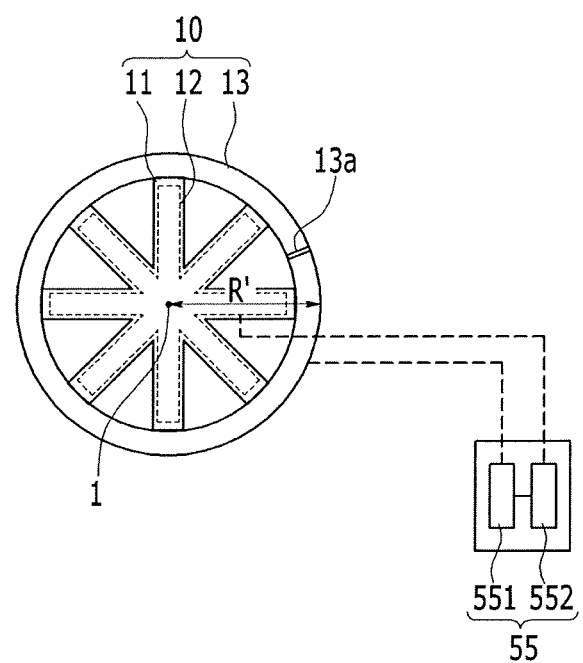
FIG. 5 illustrates an enlarged view of the internal structure of the roller in a state in which a radius of the roller of FIG. 4 is reduced.

FIG. 4 illustrates an enlarged view of an internal structure of the roller 10 of FIG. 3, and FIG. 5 illustrates an enlarged view of the internal structure of the roller 10 in a state in which the radius (R) of the roller of FIG. 4 is reduced.

As shown in FIG. 4, the roller 10 includes an internal structure that controls the radius (R) of the roller 10 and a roller case 13 for housing the internal structure. The internal structure includes a fixing portion 11 extending in a radial direction from the rolling axis 1 corresponding to a rotational central axis at which the roller 10 rotates and a variable portion 12 of which one end is connected to the fixing portion 11.

In FIG. 4, the fixing portion 11 extends in eight radial directions, but the present invention is not limited thereto, and may extend in various radial directions.

The variable portion 12 may have a structure such that it may be inserted into the fixing portion 11. The roller case 13 may be adhered to the other end 12a of the variable portion 12 facing the one end connected to the fixing portion 11. The roller case 13 may include a flexible film. The roller case 13 may include a stretchable material. Accordingly, when the variable portion 12 is inserted into the fixing portion 11, the roller case 13 is contracted, and when the variable portion 12 extends from the fixing portion 11, the roller case 13 may be stretched. In other words, the radius (R) of the roller 10 may increase and decrease. For example, the variable portion 12 may include a mechanical moving device, such as a micromotor so that the variable portion 12 may move to extend from and withdraw into the fixing portion 11. The micromotor may be, for example, a micro electro mechanical system (MEMS) type motor.

An internal space 2 of the roller 10 is enclosed by the roller case 13 and may be filled with air. The roller case 13 may be provided with a hole 13a through which the air filled in the internal space 2 of the roller 10 may be discharged.

The sensor 551 of the roller controller 55 may be connected to the roller case 13 to sense the rotation of the roller 10. The radius varying driver 552 of the roller controller 55 may be connected to the variable portion 12 to drive the variable portion 12, thereby varying the radius (R) of the roller 10.

In an exemplary embodiment of the present invention, the radius varying driver 552 may be connected to the fixing portion 11 to drive the fixing portion 11 to retract or push outward the variable portion 12, thereby varying the radius (R) of the roller 10. For example, the fixing portion 11 may include a mechanical moving device such as a micromotor to move the variable portion 12.

When the sensor 551 of the roller controller 55 senses the rotation of the roller 10 and the stopping of the rotation of the roller 10, the radius (R) of the roller 10 may be reduced by the radius varying driver 552. For example, when the roller 10 is rotating to receive the display panel 20 and the sensor detects the rotation of the roller 10 and, then, the stopping of the rotation, the radius (R) of the roller 10 may be reduced by the varying driver 552.

As shown in FIG. 5, the radius varying driver 552 connected to the variable portion 12 may drive the variable portion 12 to be inserted into the fixing portion 11. When the variable portion 12 is inserted into the fixing portion 11, the roller case 13 adhered to the variable portion 12 moves in a direction toward the rolling axis 1. As such, the variable portion 12 is inserted into the fixing portion 11, thereby reducing the radius (R) of the roller 10 to a radius (R').

Figure 6:
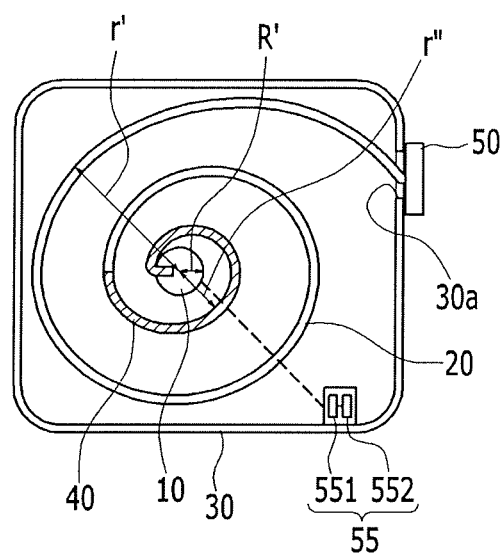
FIG. 6 illustrates a side cross-sectional view of a state in which a radius of a roller of a rollable display device, according to an exemplary embodiment of the present invention, is reduced.

FIG. 6 illustrates a side cross-sectional view of a state in which a radius (R') of a roller 10 of a rollable display device according to an exemplary embodiment of the present invention is reduced.

As shown in FIG. 6, when the radius (R) of the roller 10 is reduced to radius (R'), the dummy panel 40 connected to the roller 10 and the display panel 20 may be loosely wound around the roller 10. Accordingly, a curvature radius (r') of the display panel 20 increases. Thus, the stress applied to the display panel 20 may be minimized, thereby preventing degradation of the display panel 20.

In this case, a curvature radius (r") of some of the dummy panel 40 adjacent to the roller 10 having the reduced radius (R') may be smaller than the radius (R) of the roller 10 before being reduced.

Although the radius (R) of the roller 10 is reduced by the variable portion 12 in an exemplary embodiment of the present invention, in some exemplary embodiments of the present invention, while the roller case 13 rotates, the roller case 13 may be wound into itself to reduce the radius (R) of the roller 10.

Hereinafter, a rollable display device according to an exemplary embodiment of the present invention will be described with reference to FIG. 7 and FIG. 8.

Figure 7:
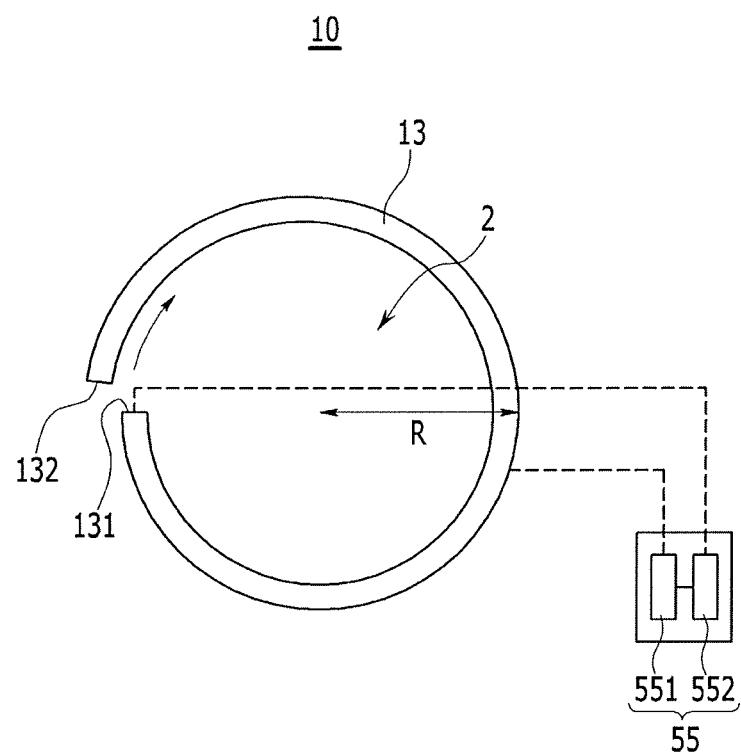
FIG. 7 illustrates an enlarged view of an internal structure of a roller in a state in which a display panel is wound around the roller of a rollable display device according to an exemplary embodiment of the present invention.
Figure 8:
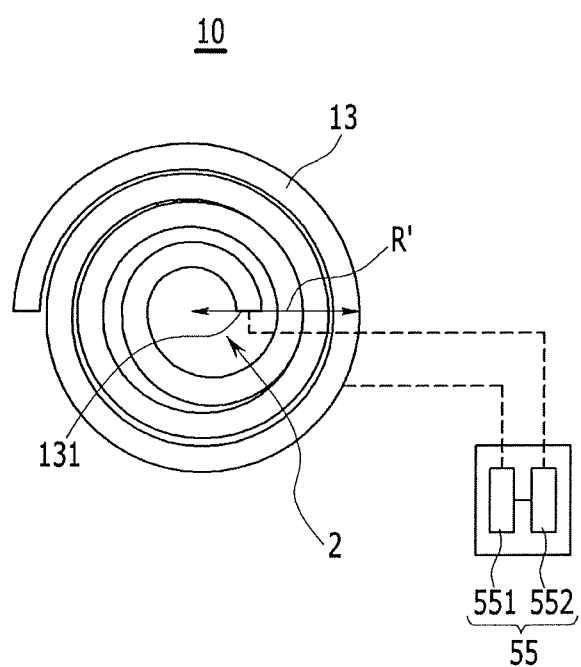
FIG. 8 illustrates an enlarged view of an internal structure of a roller in a state in which a radius of the roller of a rollable display device according to an exemplary embodiment of the present invention is reduced.

FIG. 7 illustrates an enlarged view of an internal structure of a roller 10 in a state in which a display panel 20 is wound around the roller 10 of a rollable display device according to an exemplary embodiment of the present invention, and FIG. 8 illustrates an enlarged view of an internal structure of a roller 10 in a state in which a radius (R) of the roller 10 of a rollable display device according to an exemplary embodiment of the present invention is reduced.

The exemplary embodiment of the present invention shown in FIG. 7 and FIG. 8 is substantially the same as exemplary embodiments shown in FIG. 1 to FIG. 6 except for a structure of a roller 10, and thus a repeated description may be omitted.

As shown in FIG. 7, a roller 10 of a rollable display device according to an exemplary embodiment of the present invention includes a roller case 13 provided with one end 131 and another end 132. The roller case 13 is wound such that the one end 131 and the other end 132 face each other. The roller case 13 is wound for a radius (R) of a cross-section thereof, which has a circular shape. Accordingly, the roller 10 includes the internal space 2 enclosed by the roller case 13.

The sensor 551 of the roller controller 55 may be connected to the roller case 13 to sense the rotation of the roller

10. The radius varying driver 552 of the roller controller 55 may be connected to the one end 131 of the roller case 13 to pull the one end 131, thereby varying the radius (R) of the roller 10. For example, the radius varying driver 552 may include an actuator.

As shown in FIG. 8, the radius varying driver 552 connected to the one end 131 pulls the one end 131. The one end 131 of the roller case 13 moves in an inside direction of the other end 132 of the roller case 13. In other words, the one end 131 is moving in an inside direction toward a rolling axis 1 corresponding to a rotational central axis of the roller 10. As such, while the one end 131 of the roller case 13 continuously moves in the inside direction of the other end 132 of the roller case 13, the roller case 13 is wound. Accordingly, the internal space 2 surrounded by the roller case 13 is minimized, and thus, the radius (R') of the roller 10 is reduced.

Although the stress applied to the display panel 20 may be minimized by reducing the radius (R) of the roller 10 in an exemplary embodiment of the present invention, the stress applied to the display panel may also be reduced by loosely winding the display panel 20 around the roller 10 in an exemplary embodiment of the present invention.

Hereinafter, a rollable display device according to an exemplary embodiment of the present invention will be described with reference to FIG. 9 to FIG. 14.

Figure 9:
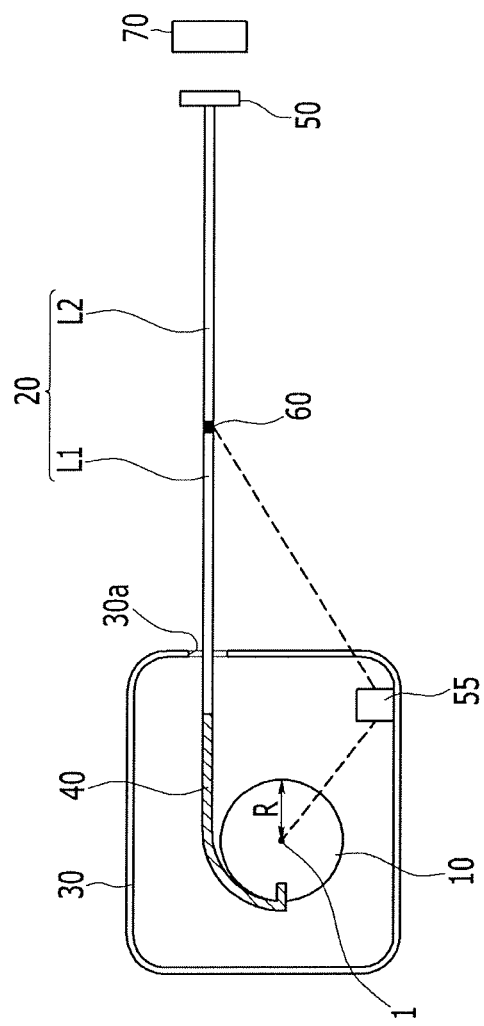
FIG. 9 illustrates a side cross-sectional view of a state in which a display panel of a rollable display device according to an exemplary embodiment present invention is unrolled.

FIG. 9 illustrates a side cross-sectional view of a state in which a display panel 20 of a rollable display device according to an exemplary embodiment of the present invention is unrolled.

The exemplary embodiment shown in FIG. 9 is substantially the same as exemplary embodiments of the present invention shown in FIG. 1 to FIG. 6 except for a roller 10, a sensor 60, and a pressing portion 70, and thus a repeated description may be omitted.

As shown in FIG. 9, since the inside of a roller 10 of a rollable display device according to an exemplary embodiment of the present invention is filled, the radius (R) of the roller 10 is constant. A sensor 60 is disposed at a predetermined position of the display panel 20. When the sensor 60 senses that the panel entrance 30a and the sensor 60 are substantially aligned, the sensor 60 transmits a sensing signal for stopping the rotation of the roller 10 or for rotating the roller 10 to the roller controller 55. The display panel 20 is divided into a first panel portion L1 and a second panel portion L2 based on the positioning of the sensor 60. In addition, a pressing portion 70, which may be used by a user to press the panel fixing portion 50, is positioned apart from the panel fixing portion 50.

The roller controller 55 is connected to the roller 10 and the sensor 60 by a wire or wirelessly. The roller controller 55 may stop the rotation of the roller 10 or may rotate the roller 10 depending on the sensing signal transmitted from the sensor 60 to the roller controller 55. The roller controller 55 may be connected to the rolling axis 1 of the roller 10.

Hereinafter, a driving method of the rollable display device according to an exemplary embodiment the present invention will be described with reference to FIGS. 10 to 12.

Figure 10:
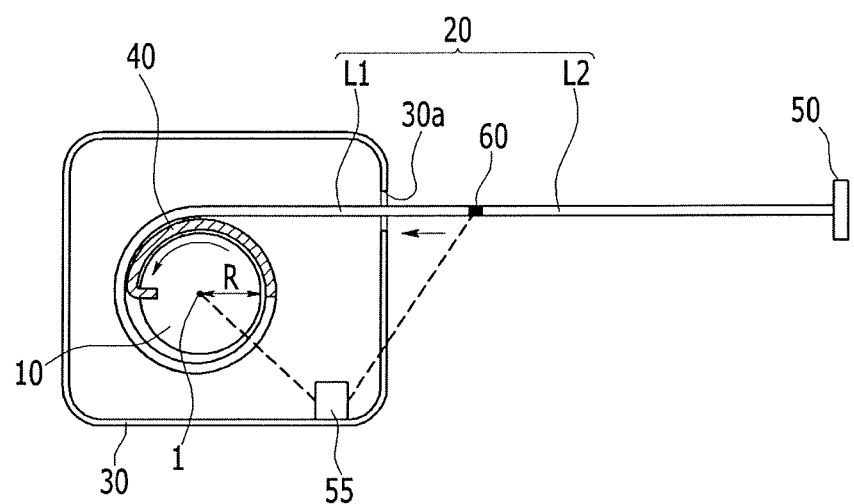
FIG. 10 to FIG. 12 sequentially illustrate processes of minimizing stress applied to a display panel by using the rollable display device of FIG. 9 in a state in which the display panel is wound around a roller.
Figure 11:
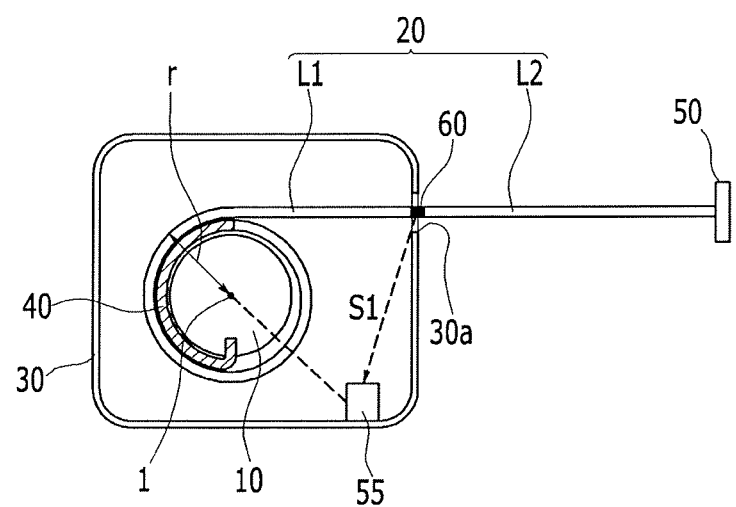
Figure 12:
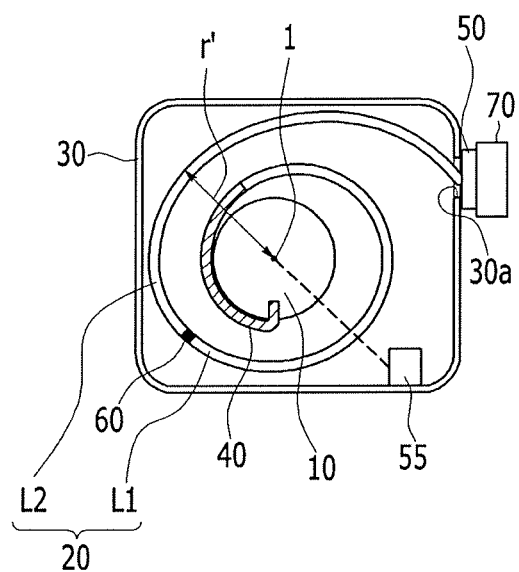

FIG. 10 to FIG. 12 sequentially illustrate processes of minimizing the stress applied to the display panel 20 by using the rollable display device of FIG. 9 in a state in which the display panel 20 is wound around the roller 10.

As shown in FIG. 10, as the roller 10 rotates, the dummy panel 40 and the first panel portion L1 of the display panel 20 are wound. In this case, the sensor 60 provided at the display panel 20 also moves in the direction in which the roller 10 is positioned as the display panel 20 is wound.

Next, as shown in FIG. 11, when a state in which the sensor 60 is positioned at the panel entrance 30a is sensed, the sensor 60 transmits a sensing signal S1 for stopping the rotation of the roller 10 to the roller controller 55. The roller controller 55 stops the rotation of the roller 10 depending on the sensing signal S1 transmitted from the sensor 60. In this case, the first panel portion L1 of the display panel 20 is positioned inside the housing 30, and the second panel portion L2 of the display panel 20 is positioned outside the housing 30.

In addition, the curvature radius (r) of some of the display panel 20 wound around the roller 10 is almost equal to the radius (R) of the roller 10.

Then, as shown in FIG. 12, the pressing portion 70 presses against the panel fixing portion 50 to push the second panel portion L2 of the display panel 20 into the housing 30. For example, the pressing portion 70 may connect to the panel fixing portion 50. The pressing portion 70 may be used by a user to push the second panel portion L2. Accordingly, the dummy panel 40 connected to the roller 10 and the display panel 20 are loosely wound around the roller 10. Accordingly, the curvature radius (r') of the display panel 20 increases. Thus, the stress applied to the display panel 20 may be minimized, thereby preventing the degradation of the display panel 20 in a state in which the display panel 20 is positioned in the housing 30.

Figure 13:
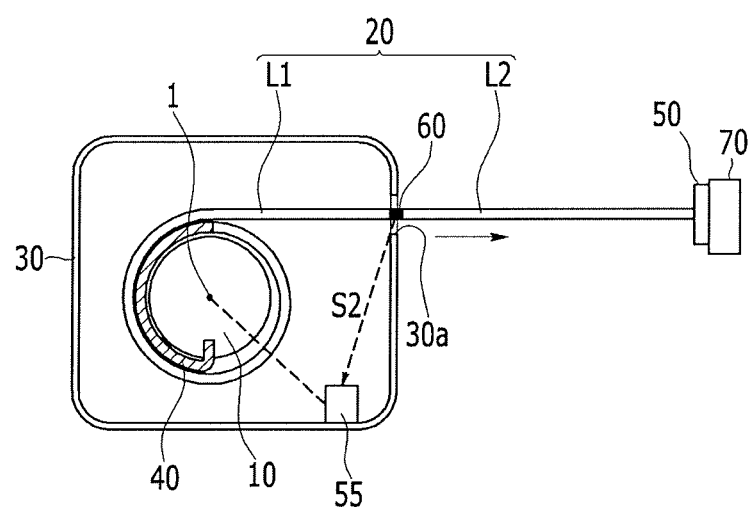
FIG. 13 and FIG. 14 sequentially illustrate processes in which a display panel is unrolled by using the rollable display device of FIG. 9.
Figure 14:
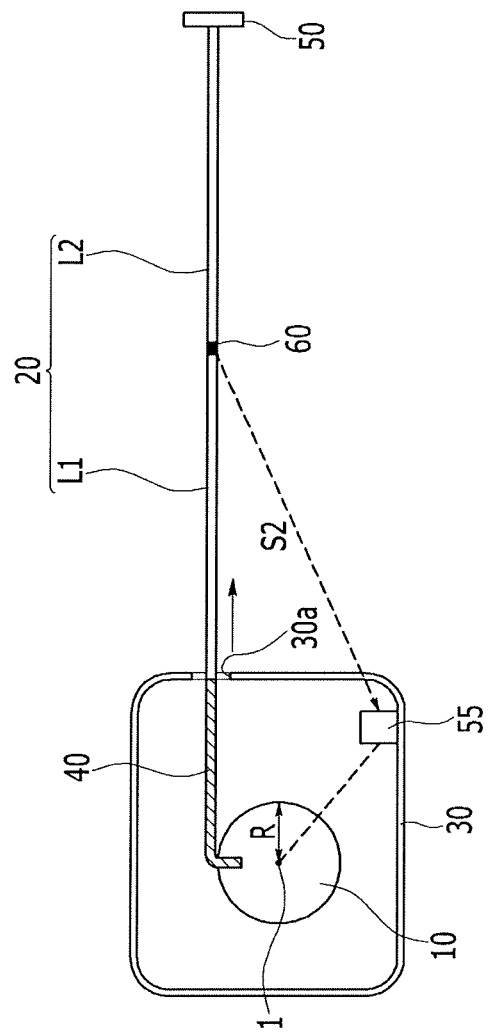

FIG. 13 and FIG. 14 sequentially illustrate processes in which the display panel 20 is unrolled by using the rollable display device of FIG. 9.

As shown in FIG. 13, until the sensor 60 is positioned at the panel entrance 30a, the panel fixing portion 50 is pulled by the pressing portion 70. Accordingly, some of the first panel portion L1 of the display panel 20 is closely wound around the roller 10. The second panel portion L2 of the display panel 20 exits out of the housing 30. In this case, the sensor 60 senses a state in which it is positioned at the panel entrance 30a and transmits a sensing signal S2 rotate the roller 10 to the roller controller 55. The sensing signal S2 is a signal to rotate the roller 10 in a direction such that the display panel 20 is unwound.

Then, as shown in FIG. 14, the roller controller 55 rotates the roller 10 depending on the sensing signal S2 transmitted from the sensor 60. When the roller 10 rotates, since some of the first panel portion L1 of the display panel 20 is closely wound around the roller 10, the first panel portion L1 of the display panel 20 exits out of the housing 30.

While the present invention has been particularly shown and described with reference to exemplary embodiments thereof, it will be apparent to those of ordinary skill in the art that various changes in form and detail may be made thereto without departing from the spirit and scope of the present invention.

What is claimed is:

1. A rollable display device comprising:
   a roller;
   a display panel configured to be wound around the roller in a wound-up configuration and to display an image in an unwound configuration;
   a housing configured to house the display panel in the wound-up configuration and the roller; and
   a roller controller connected to the roller, configured to change a radius of the roller, and including a sensor that is connected to the roller and senses a rotation of the roller and a stopping of the rotation of the roller, wherein when the display panel is in the wound-up configuration and the sensor detects that the roller has stopped rotating, the sensor will send a signal for the roller controller to reduce the radius of the roller.

2. The rollable display device of claim 1, further comprising
a dummy panel connected to the roller and one end of the display panel.

3. The rollable display device of claim 2, wherein
one end of the dummy panel is fixed to the roller.

4. The rollable display device of claim 1, wherein the roller controller includes:
a radius varying driver that is connected to the sensor and the roller and is configured to change the radius of the roller.

5. The rollable display device of claim 4, wherein the roller includes:
a fixing portion extending in a radial direction from a rolling axis corresponding to a rotational central axis of the roller,
a variable portion of which one end is connected to the fixing portion, and
a roller case housing the fixing portion and the variable portion.

6. The rollable display device of claim 5, wherein
the roller case is adhered to the other end of the variable portion.

7. The rollable display device of claim 5, wherein
the fixing portion configured to be inserted into the variable portion, and
when the variable portion is inserted into the fixing portion, the radius of the roller is reduced.

8. The rollable display device of claim 5, wherein
the roller case includes a flexible film.

9. The rollable display device of claim 4, wherein
the roller includes a roller case including a first end and a second end, and
the roller case is wound such that the first end and the second end face each other.

10. The rollable display device of claim 9, wherein
when the first end of the roller case is wound in an inside direction toward a roiling axis corresponding to a rotational central axis of the roller, wherein the radius of the roller is reduced.

11. The rollable display device of claim 9, wherein
the roller case includes a flexible film.

12. The rollable display device of claim 1, wherein
the housing including a panel opening through which the display panel passes through in an unwound configuration.

13. The rollable display device of claim 12, further comprising
a panel fixing portion configured to be positioned at one end of the display panel and to have a height larger than a width of the panel opening.

14. The rollable display device of claim 1, further comprising a pressing portion configured to connect to a panel fixing portion connected to the display panel, wherein the pressing portion pushes or pulls the panel fixing portion.

15. The rollable display device of claim 1, wherein
the inside of the roller is filled.

16. A rollable display device comprising:
a display panel;
a roller configured to receive the display panel in a wound-up configuration and including a fixing portion including a plurality of ends extending in different radial directions from a rolling axis corresponding to a rotational central axis of the roller, and a plurality of variable portions, wherein each variable portion includes a first end connected to the fixing portion and is configured to withdraw into one end of the plurality of ends of the fixing portion toward the rolling axis;
a housing configured to house the display panel in the wound-up configuration, the housing includes an opening, which the display panel passes through in an unwound configuration;
a sensor to detect a rotation of the roller; and
a radius varying driver connected to the sensor and the plurality of variable portions and configured to alter a radius of the roller.

17. The rollable display device of claim 16, wherein the roller includes a roller case including a flexible film.

18. The rollable display device of claim 17, wherein each variable portion includes a second end, opposite to the first end of each variable portion, connected to the roller case, and wherein the roller case houses the fixing portion and the plurality of variable portions.

19. The rollable display device of claim 1, wherein the housing includes a panel opening, and when the sensor senses that the panel opening and the sensor are substantially aligned, the sensor generates the sensing signal for controlling the rotation of the roller.

* * * * *